(12) United States Patent
Lee

(10) Patent No.: US 6,265,682 B1
(45) Date of Patent: Jul. 24, 2001

(54) TOUCH SWITCH

(75) Inventor: Do Mun Lee, Kumi (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/433,878

(22) Filed: Nov. 4, 1999

(30) Foreign Application Priority Data

Nov. 7, 1998 (KR) ................................................ 98-47713

(51) Int. Cl.⁷ .............................................. H03K 17/975
(52) U.S. Cl. .......................................................... 200/600
(58) Field of Search ........................ 200/5 A, 512–517, 200/600; 341/22–35

(56) References Cited

U.S. PATENT DOCUMENTS

| | | | |
|---|---|---|---|
| 3,887,848 | * | 6/1975 | Larson et al. ...................... 200/600 X |
| 4,056,699 | * | 11/1977 | Jordan ................................... 200/5 A |
| 4,064,688 | * | 12/1977 | Sasaki et al. ...................... 200/600 X |
| 4,211,497 | * | 7/1980 | Montgomery ........................ 400/486 |
| 4,244,040 | * | 1/1981 | Fondiller et al. ........................ 368/69 |
| 4,304,976 | * | 12/1981 | Gottbreht et al. ............... 361/280 X |
| 4,751,625 | * | 6/1988 | Lin ....................................... 362/276 |
| 5,917,165 | * | 6/1999 | Platt et al. ............................ 200/600 |

\* cited by examiner

*Primary Examiner*—J. R. Scott
(74) *Attorney, Agent, or Firm*—Fleshner & Kim, LLP

(57) ABSTRACT

A touch switch in accordance with the present invention prevents a static electricity change from being transferred between an electric device incorporating the touch switch and a user of the device, thereby improving convenience and safety. The touch switch incorporates a dielectric layer to be touched by the user, and an electrically conductive layer on a side of the dielectric layer not touched by the user. A touch switch embodying the invention may include a protective layer formed over the electrically conductive layer to prevent oxidation of the electrically conductive layer. A touch switch embodying the invention may also include a conductive member connecting the electrically conductive layer of the touch member to a circuit of an associated circuit board.

18 Claims, 2 Drawing Sheets

TOUCH SWITCH

BACKGROUND OF THE INVENTION

1. Field of the Invention

The present invention relates to a touch switch in an indirect touch method for electric and electronic products, and a method for fabricating an electrified layer thereof, and in particular to a touch switch, and a method for fabricating an electrified layer thereof which can improve convenience and safety, by providing a method for forming an electrified layer on a surface of a ferroelectric material, such as glass, mica and epoxy, and a touch switch using the same.

2. Description of the Background Art

A conventional touch switch will now be described in detail with reference to the accompanying drawings.

FIG. 1 is a cross-sectional view partially illustrating the conventional touch switch.

As shown therein, the conventional touch switch includes a control button 10 plated with a plating film and pushed for operating a function key of the electric or electronic products, one end portion of which being fixed by a screw 12 to one inner portion of a cabinet 11, another portion of which being exposed to an outer portion of the cabinet 12, thus composing a touch unit 12a.

A groove unit 12b is formed at an inner portion of the touch unit 12a of the control button 10. A conductive resin 14 is provided having its lower portion disposed at the groove unit 12b. A pin 13 is inserted into an upper portion of the conductive resin 14.

In addition, a printed circuit board 15 is disposed at an upper portion of the control button 10. Here, the pin 13 is protruded through the upper surface of the printed circuit board 15.

A copper thin plate 17 is provided at the upper surface of the printed circuit board 15, separately from the protruding portion of the pin 13 by a predetermined distance in order to generate an electrification phenomenon 16 with the pin 13 through which a slight current is transmitted. When the slight current generated by the electrification phenomenon between the copper thin plate 17 and the pin 15 is transmitted, a microcomputer 18 operates the function key.

The operation of the conventional touch switch will now be explained.

When the user touches the touch unit 12a of the control button 10 disposed at the cabinet 11 with his finger 20 in order to operate the function key of the electric or electronic product, the slight current flowing through the body of the user is transmitted to the conductive resin 14 via the plated control button 10.

The slight current transmitted to the conductive resin 14 generates the electrification phenomenon 16 between the pin which is protrudingly installed in the printed circuit board 14 and the copper thin plate 17 which is separated from the pin 13 by a predetermined distance and provided on the upper surface of the printed circuit board 14.

The slight current is transmitted to the microcomputer 18 according to the electrification phenomenon, thereby operating the function key.

However, the conventional touch switch has a disadvantage in that a static electricity generated from the electric or electronic product is accumulated in the control button and discharged through the body of the user, when the user touches the touch unit of the control button, thereby causing an electric shock. Conversely, the static electricity accumulated in the body of the user may be instantly transmitted to the microcomputer through the printed circuit board, thereby causing a defect of the electric or electronic product.

In addition, the plated control button is used as a medium for transmitting the slight current flowing through the body of the user to the conductive resin, thereby causing an environment contamination.

SUMMARY OF THE INVENTION

Accordingly, it is an object of the present invention to provide a touch switch an d a method for fabricating an electrified layer thereof which can improve convenience and safety, by providing a method for forming an electrified layer on a surface of a dielectric material, such as glass, mica and epoxy, in order to increase electrification of electrons, and a touch switch using the same.

In order to achieve the above-described object of the present invention, there is provided a method for fabricating an electrified layer, including: a step of forming an editing plate by spreading and drying an emulsion on a surface of a net, editing a film, adhering it on a surface of the emulsion, and exposing it to an ultraviolet light; a step of putting the editing plate on the surface of a glass plate, printing a mixture of silver powder and ceramic powder, and removing the editing plate; and a step of forming an electrified layer by heating the glass plate where the mixture is printed, and performing an air cooling operation thereon.

There is also provided a touch switch device including: a printed circuit board fixed in a cabinet; a touch member consisting of a dielectric material, one side portion of which being spread with an electrified layer consisting of an electrified material; and a conductive member connecting the portion of the touch member spread with the electrified layer to the printed circuit board.

BRIEF DESCRIPTION OF THE DRAWINGS

The present invention will become better understood with reference to the accompanying drawings which are given only by way of illustration and thus are not limitative of the present invention, wherein:

FIGS. 3A to 3D are views illustrating sequential steps of a method for fabricating an electrified layer of the touch switch in accordance with the preferred embodiment of the present invention, wherein:

FIG. 3A shows a film editing and ultraviolet light transmission process;

FIG. 3B shows an editing plate forming process;

FIG. 3C shows an original plate forming process; and

FIG. 3D shows a glass enhancing process.

DETAILED DESCRIPTION OF THE PREFERRED EMBODIMENTS

A touch switch and a method for fabricating an electrified layer thereof in accordance with a preferred embodiment of the present invention will now be described in detail with reference to the accompanying drawings thereof.

Figure 1:
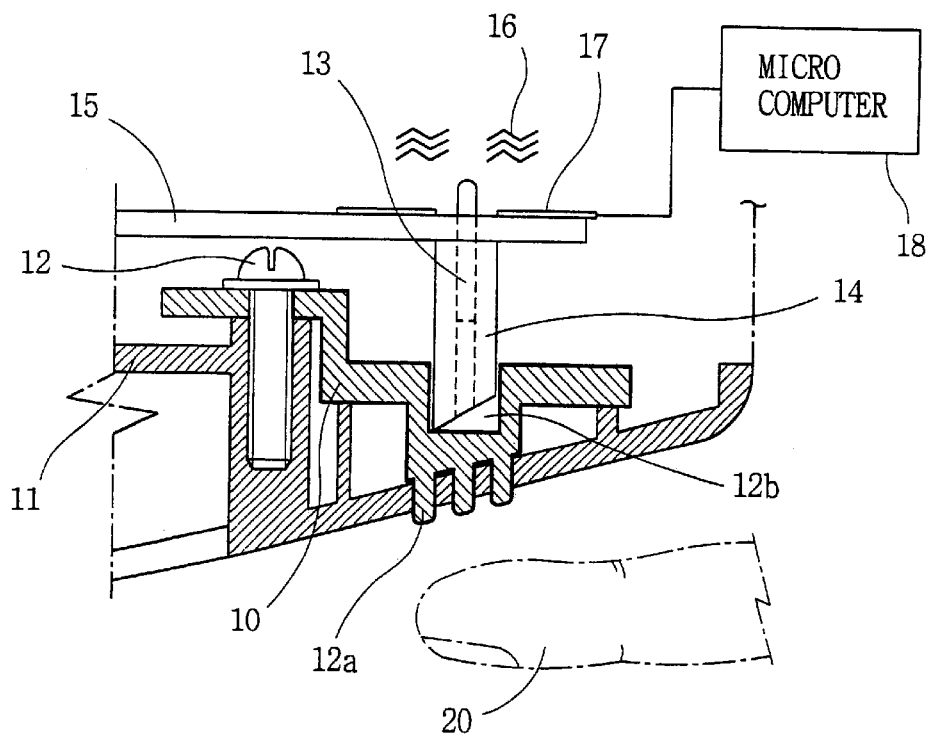
FIG. 1 is a cross-sectional view partially illustrating a conventional touch switch.
Figure 2:
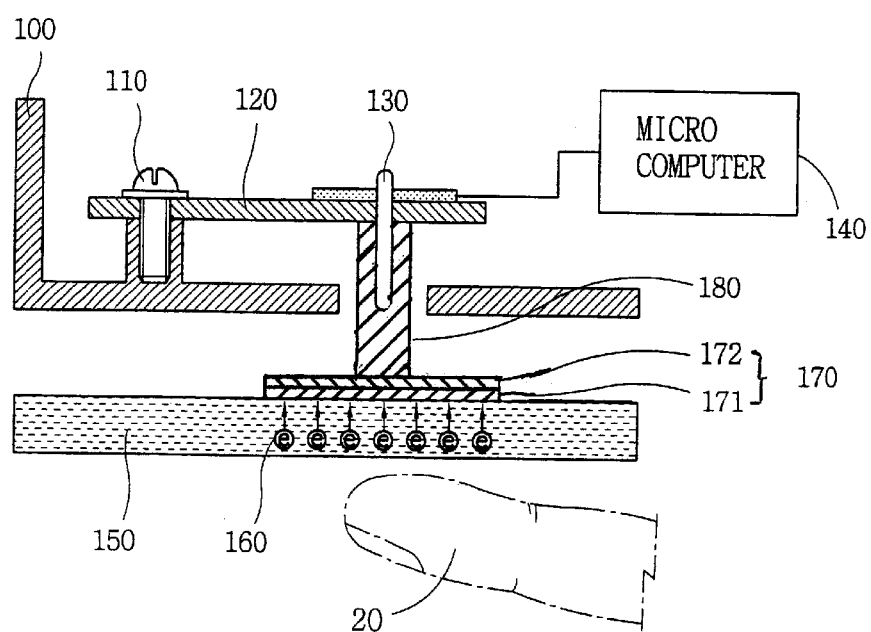
FIG. 2 is a cross-sectional view partially illustrating a touch switch in accordance with a preferred embodiment of the present invention.

FIG. 2 is a cross-sectional view partially illustrating the touch switch in accordance with the present invention. As shown therein, a printed circuit board 120 having its one side end portion fixed by a screw 110 is provided at one inner portion of a cabinet 100 having a through hole 101 at one side.

In addition, a glass plate 150 which is a touch member touching a function key to be operated is provided at the outside of the cabinet 100, an electrified layer 170 spread with a silver 171 and a ceramic 172 and generating an electrification phenomenon 160 is formed at one side portion of the glass plate 150, and a conductive resin 180 is contacted and fixed to a bottom surface of the printed circuit board 120 through the through hole 101 of the cabinet, one side of which being contacted and fixed to the ceramic 172, a metal pin 130 being inserted into the other side.

There is provided a microcomputer 140 operating the function key when a slight current generated by the electrification phenomenon of the electrified layer 170 is transmitted through the conductive resin 180, the metal pin 130 and the printed circuit board 120.

Here, the glass plate which is an ferroelectric material may be replaced by a mica or epoxy.

On the other hand, the fabrication process and method for the electrified layer generating the electrification phenomenon will now be explained in detail with reference to FIGS. 3A to 3D.

Figure 3A:
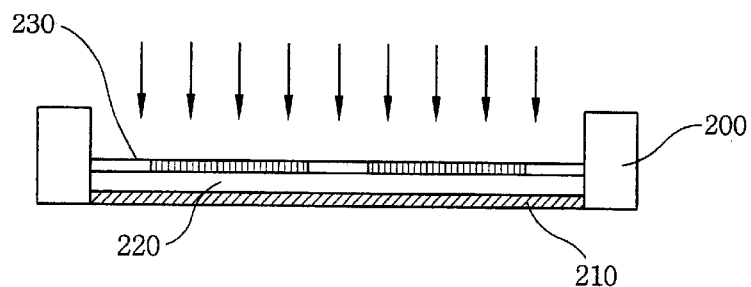
Figure 3B:
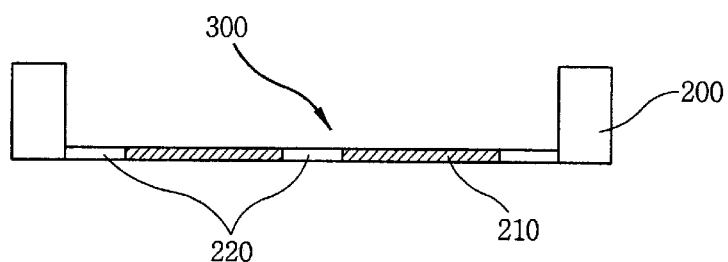
Figure 3C:
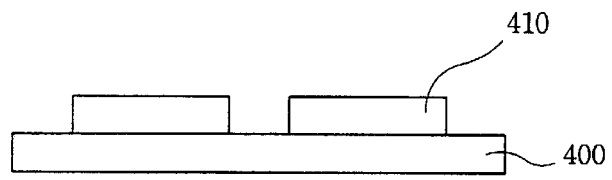
Figure 3D:
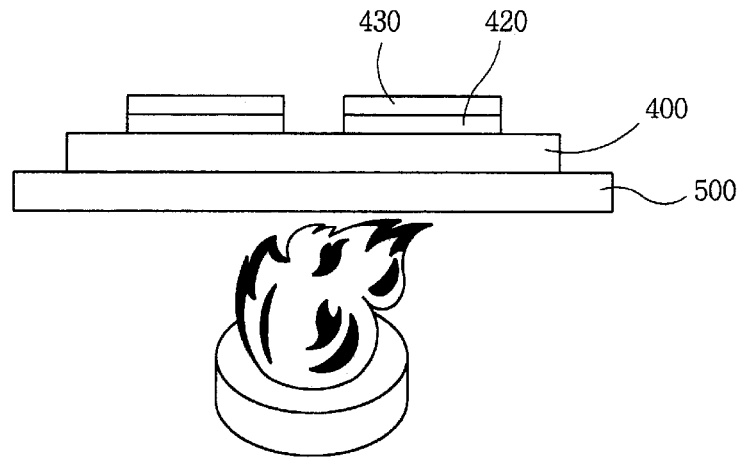

FIGS. 3A to 3D are views illustrating sequential steps of the method for fabricating the electrified layer of the touch switch in accordance with the preferred embodiment of the present invention. FIG. 3A shows a film editing and ultraviolet light transmission process, FIG. 3B shows an editing plate forming process, FIG. 3C shows an original plate forming process, and FIG. 3D shows a glass enhancing process.

According to the method for fabricating the electrified layer of the present invention, as shown in the film editing and ultraviolet light transmission process of FIG. 3A, an emulsion 220 which is a coating solution is spread and dried on a surface of a net 210 fixed to an aluminum frame 200, and an edited film 230 is adhered to an upper portion of the emulsion 220 and exposed to the ultraviolet light.

The film 230 is edited to have positive/negative properties in advance, and the ultraviolet light is selectively transmitted to the emulsion 220.

Thereafter, as shown in the editing plate forming process of FIG. 3B, the stacked structure exposed to the ultraviolet light is cleansed, thereby forming an editing plate 300.

Here, the emulsion 220 remains merely at the region where the ultraviolet light is transmitted, and appears on the net 210.

Thereafter, as shown in the original plate forming process of FIG. 3C, the editing plate 300 is put on a glass plate 400, and a mixture 400 of silver powder and ceramic powder is silk-screen printed. Then, the editing plate 300 is removed, thus forming the original plate.

When the original plate is formed, as shown in FIG. 3D, the glass enhancing process for putting the original plate on a heating furnace 500, and heating it at a temperature of 400° C. to 600° C. is carried out.

Here, in the mixture 410 of silver powder and ceramic powder, a silver having a greater specific gravity is firstly melted on a surface of the glass plate 400, thereby forming the silver layer 420, and a ceramic is melted on the silver layer 420, thereby forming the ceramic layer 430. Thus, the silver layer 420 is prevented from being oxidized at the air.

In addition, in the glass enhancing process, the heating temperature is set between 400° C. and 600° C. because it is most appropriate to the process for fabricating the electrified layer in accordance with the present invention, among the heating temperatures for enhancing the glass.

The operation of the touch switch having the electrified layer fabricated in accordance with the above-described method will now be described with reference to FIG. 2.

When the user touches the glass plate 150 with his finger 20 in order to operate the function key of the electric or electronic product, the slight current flowing through the body of the user generates the electrification phenomenon 160, and it is transmitted to the surface of the silver 171.

Here, the glass plate 150 is operated similarly to a capacitor of circuit components. The performance of the capacitor is represented by the following expression.

[Expression I]

$$C \propto g \times \frac{S}{l}$$

(C: capacity of static electricity; g: density of medium (conductivity); S: area of silver layer; I: thickness of glass plate)

Accordingly, the silver 171 formed on the surface of the glass plate 150 plays an important role in generating the electrification phenomenon 160.

The slight current transmitted to the silver 171 is transmitted to the conductive resin 180 via the ceramic 172, and transmitted to the microcomputer 140 through the metal pin 130 and the printed circuit board 120, thereby operating the function key.

As discussed earlier, the touch switch and the method for fabricating the electrified layer thereof in accordance with the present invention interrupt the static electricity generated from the electric products or user by using the glass plate, thereby improving convenience and safety, and do not use the plated control button, thereby protecting the environment.

In addition, the electrification phenomenon is maximized by forming the electrified layer at one side portion of the glass plate, thereby reliably operating the function key of the electric or electronic products.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A touch switch device comprising:
    a dielectric layer having a first side configured to be touched by a user;
    a touch member formed on a second side of the dielectric layer, wherein the touch member includes an electrially conductive layer and a protective layer; and
    a conductive member coupled to the touch member, wherein the conductive member is configured to electrically couple the touch member to a printed circuit board.

2. The device according to claim 1, wherein the dielectric layer comprises is a ferroelectric material.

3. The device according to claim 1, wherein the dielectric layer comprises a glass plate.

4. The device according to claim 1, wherein the dielectric layer comprises mica.

5. The device according to claim 1, wherein the dielectric layer comprises an epoxy.

6. The device according to claim 1, wherein the conductive member comprises a conductive resin.

7. The device according to claim 1, wherein the electrically conductive layer comprises a silver layer and wherein the protective layer comprises a ceramic layer.

8. The device according to claim 1, wherein the electrically conductive layer is formed directly on the dielectric layer, and wherein the protective layer is formed over the electrically conductive layer.

9. A touch switch, comprising:
   a touch pad having a first side configured to be touched by a user, wherein the touch pad comprises a dielectric material;
   an electrically conductive layer formed on a second side of the touch pad opposite the first side; and
   a protective layer formed over the electrically conductive layer.

10. The touch switch of claim 9, wherein the protective layer is configured to reduce oxidation of the electrically conductive layer.

11. The touch switch of claim 9, wherein the electrically conductive layer comprises a metal.

12. The touch switch of claim 11, wherein the protective layer comprises a ceramic.

13. The touch switch of claim 9, wherein the protective layer comprises a ceramic.

14. The touch switch of claim 9, wherein the touch pad comprises at least one material selected from the group consisting of glass, mica, and epoxy.

15. The touch switch of claim 9, wherein the touch pad comprises a ferroelectric material.

16. The touch switch of claim 9, further comprising a conductive member configured to electrically couple the electrically conductive layer to an external circuit.

17. The touch switch of claim 16, wherein the conductive member is attached to the protective layer.

18. The touch switch of claim 16, wherein the conductive member comprises a conductive resin.

* * * * *